United States Patent [19]

Tanaka et al.

[11] Patent Number: 5,055,710
[45] Date of Patent: Oct. 8, 1991

[54] INTEGRATED LOGIC CIRCUIT HAVING PLURAL INPUT CELLS AND FLIP-FLOP AND OUTPUT CELLS ARRANGED IN A CELL BLOCK

[75] Inventors: Kazuo Tanaka; Masato Hamamoto; Toshio Yamada, all of Tokyo; Tohru Kobayashi, Iruma; Hiromasa Katoh, Tokyo, all of Japan

[73] Assignee: Hitachi, Ltd., Tokyo, Japan

[21] Appl. No.: 520,875

[22] Filed: May 9, 1990

Related U.S. Application Data

[63] Continuation of Ser. No. 133,915, Dec. 16, 1987.

[30] Foreign Application Priority Data

Dec. 26, 1986 [JP] Japan .................................. 61-308441
Jan. 16, 1987 [JP] Japan ..................................... 62-5973

[51] Int. Cl.$^5$ ....................... H01L 25/00; H01K 3/284; G06F 7/38
[52] U.S. Cl. ............... 307/303.1; 307/482.1; 307/272.1; 307/465
[58] Field of Search ...................... 307/303.1, 455, 456, 307/467, 272.1, 465, 482.1; 377/73; 371/22.5; 357/45

[56] References Cited

U.S. PATENT DOCUMENTS

| | | | |
|---|---|---|---|
| 4,357,703 | 11/1982 | Van Brunt | 371/15 |
| 4,527,079 | 7/1985 | Thompson | 307/443 |
| 4,926,066 | 5/1990 | Maini et al. | 307/303.1 |

FOREIGN PATENT DOCUMENTS

84/02580 7/1984 European Pat. Off. ........... 371/22.5

Primary Examiner—David Hudspeth
Assistant Examiner—Trong Phan
Attorney, Agent, or Firm—Antonelli, Terry, Stout & Kraus

[57] ABSTRACT

Flip-flops are disposed corresponding to input circuits or output circuits of an integrated logic circuit so as to be cascaded to configure a shift register for a test and to enable a parallel transfer of data between each flip-flop and a corresponding input or output circuit. As a result, without connecting the probe to all terminals of the LSI, test signals can be supplied from some terminals via all input circuits to an internal circuit so as to conduct a diagnosis.

4 Claims, 9 Drawing Sheets

INTEGRATED LOGIC CIRCUIT HAVING PLURAL INPUT CELLS AND FLIP-FLOP AND OUTPUT CELLS ARRANGED IN A CELL BLOCK

This is a continuation of application Ser. No. 133,915, filed Dec. 16, 1987.

BACKGROUND OF THE INVENTION

The present invention relates to a semiconductor integrated circuit technology, and in particular, to a technology efficiently applicable to an input system of a test signal in an integrated logic circuit including a diagnosis circuit operating in the scanning method; furthermore, a technology is effectively applicable to a semiconductor integrated circuit device particularly having a great number of input/output pins such as a gate array circuit.

Recently, in a large scale integrated circuit device (LSI) formed on a semiconductor substrate, the number of input/output pins have been increased, for example, several hundred pins are disposed which is a considerable amount. In such a logic LSI having many input/output pins, diagnosis of the internal circuits thereof has become difficult because of the following reasons. That is, in the case where the LSI test is effected through the all-pin probe check, since the distance between pins is decreased when a great number of input/output pins (terminals) are provided, all probe pins cannot be easily brought into contact with all terminals (pads). Particularly, in an LSI employing a controlled collapse bonding (CCB) system as the pad structure, the contact between the pads and the probe pins cannot be readily established.

On the other hand, as a method of diagnosing a logic LSI, there has been proposed a scan method in which flip-flops disposed in the internal circuit are connected in series so as to operate the flip-flops as a shift register, thereby facilitating the test of the logic LSI ("Nikkei Electronics", the Nikkei-McGrowhill Co. Ltd., Apr. 16, 1979, pp. 57-79).

In the conventional diagnosis method employing the scan system, wirings must be designed to connect in series all flip-flops disposed in the internal circuit of the LSI, which results in a problem in that the number of designing steps is increased. Furthermore, although the diagnosis using the scan system facilitates the test of the logic circuit in a stage following the flip-flops, when testing the functions of logic gates in a range from the input circuit to the first flip-flop, a test signal must be inputted by connecting the probe to the input terminal through a separate operation. As a result, there has arisen the problem of the probe test becoming difficult in an LSI having a high terminal density. These problems have been overcome by the inventors of the present invention.

SUMMARY OF THE INVENTION

It is therefore an object of the present invention to provide an integrated logic circuit in which test signals are inputted only from some terminals or pins through all input circuits to the internal circuit without necessitating the probe to be brought into contact with all terminals of the LSI, thereby effecting a diagnosis of the LSI.

Another object of the present invention is enable to configure a shift register for a test only by slightly changing wirings in a logic LSI in which pin usages are arbitrarily changed like in a gate array.

The above and other objects and the new features of the present invention will become apparent from the following detailed description taken in conjunction with the accompanying drawings.

Representative features of the present invention will be described as follows.

That is, flip-flops are disposed corresponding to predetermined input pins and predetermined output pins so as to be connected in series, thereby constituting a shift register for a test. Thereafter, an input circuit and an output circuit are configured by use of an ECL series gate circuit. In addition to signals from an input pin, test data signals kept in a flip-flop corresponding to the shift register can be transferred to the input circuit, and the change-over of the signals can be effected by a control signal or a clock signal externally supplied to the input circuit. Furthermore, a flip-flop for a scanning operation disposed corresponding to the output circuit is enabled to fetch thereinto output data from the output circuit depending on a control signal externally supplied thereto.

According to the means above, test data can be supplied from a shift register operable for a serial transfer via the input circuit to an internal logic circuit; moreover, the output data from the output circuit can be transferred to the shift register for the test in a parallel fashion so as to be serially transferred as read data to an external device depending on a clock signal for the scanning operation. These provisions enable accomplishing the object above, namely, without necessitating to connect the probe to each pin of the LSI, test signals can be supplied from some terminals via all input circuits to the internal circuit, thereby effecting the diagnosis of the LSI.

BRIEF DESCRIPTION OF THE DRAWINGS

The present invention will be apparent from the following detailed description taken in conjunction with the accompanying diagrams in which.

DESCRIPTION OF THE PREFERRED EMBODIMENTS

Figure 1:
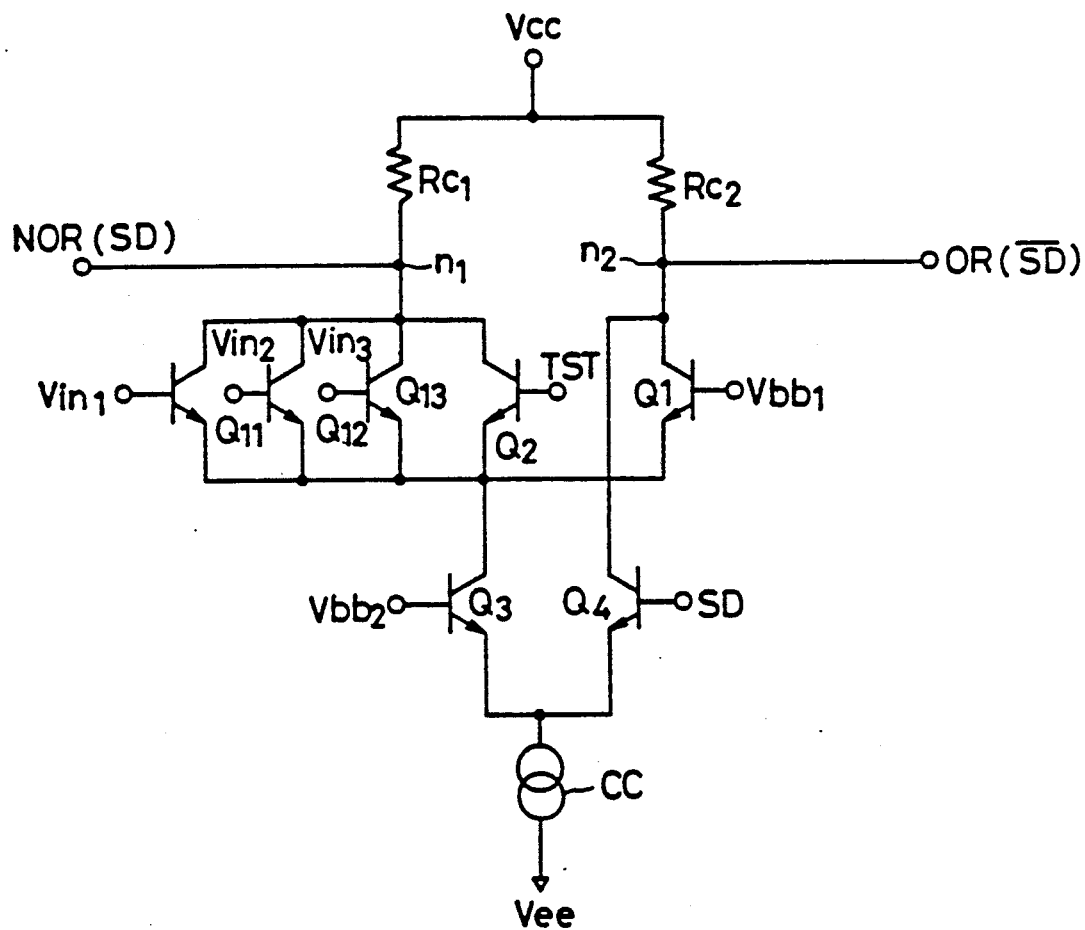
FIG. 1 is a circuit diagram schematically showing an embodiment of an input circuit of a logic LSI to which the present invention is applied.

FIG. 1 shows an embodiment of an input circuit of an emitter coupled logic (ECL) type employed in a logic LSI having a diagnosis function according to the present invention.

The output circuit includes a transistor $Q_1$ for a reference level Vbb1, three input transistors $Q_{11}$, $Q_{12}$, and $Q_{13}$ respectively having emitters commonly connected to an emitter of the transistor $Q_1$, and an input control transistor $Q_2$ of which an emitter-collector path is connected in parallel to an emitter-collector path of the input transistors $Q_{11}$, $Q_{12}$, and $Q_{13}$. Furthermore, between the common emitter terminal of the transistors $Q_{11}$, $Q_{12}$, $Q_{13}$, $Q_1$ and $Q_2$ and a constant current source CC, there is connected an emitter-collector path of a reference transistor $Q_3$ with its base biased by a reference level $V_{bb2}$. The reference transistor $Q_3$ has a base to which a reference voltage Vbb2 is applied, the reference voltage being lower than a reference voltage Vbb1. In addition, a secondary input transistor $Q_4$ is connected in series to the second reference transistor $Q_3$ with the emitters thereof commonly connected, and a collector terminal of the secondary input transistor $Q_4$ is connected to a collector terminal of the reference transistor $Q_1$.

Furthermore, a test control signal TST is applied to the base of the input control transistor $Q_2$. Ordinarily, when the control signal TST is set to a low level, the transistor $Q_2$ is set to the cut-off state.

In a state where the transistor $Q_2$ is off, the input circuit of FIG. 1 accomplishes a logic operation like that of an ordinary ECL circuit under a condition that a low-level scan data (SD) signal is applied to the base of the secondary input transistor $Q_4$ and hence the transistor $Q_4$ is off. That is, in an operation other than a test, the TST signal and the SD signal respectively applied to the bases of the transistors $Q_2$ and $Q_4$ are at the low levels, respectively, which causes the input circuit to accomplish an operation of an ECL circuit. For example, there are attained NOR and OR outputs for which node $n_1$ is set to a high level and node $n_2$ is set to a low level only when the input signals $Vin_1$ to $Vin_3$ are at the respective low levels.

On the other hand, ina test operation, since the input control transistor $Q_2$ is turned on by the control signal TST, the first reference transistor $Q_1$ is set to the cut-off state in any cases regardless of the levels of the input signals $Vin_1$ to $Vin_3$.

In this situation, when an SD signal having a level of a voltage lower than the reference voltage Vbb2 is applied to the base of the secondary input transistor $Q_4$, the transistors $Q_4$ and $Q_3$ are turned off and on, respectively. As a result, from the power supply terminal Vcc, a current is supplied via a resistor $Rc_1$ and the respective emitter-collector paths of the transistors $Q_2$ and $Q_3$ to the constant current source CC. Consequently, the nodes $n_1$ and $n_2$ are set to a low level and a high level, respectively. On the other hand, when a SD signal having a level of a voltage higher than the reference voltage $V_{BB2}$ is applied to the base of the secondary input transistor $Q_4$, the transistors $Q_3$ and $Q_4$ are turned off and on, respectively. As a result, from the power supply terminal Vcc, a current is supplied via a resistor $Rc_2$ and the respective emitter-collector path of the transistor $Q_4$ to the constant current source CC. Consequently, the nodes $n_1$ and $n_2$ are set to a high level and a low level, respectively. That is, in a state where the input control transistor $Q_2$ is on, according to the input signal SD applied to the base of the secondary input transistor $Q_4$, the nodes $n_1$ and $n_2$ are supplied with a signal having the same phase as that of the signal SD and a reverse signal of the signal SD, respectively.

Figure 2:
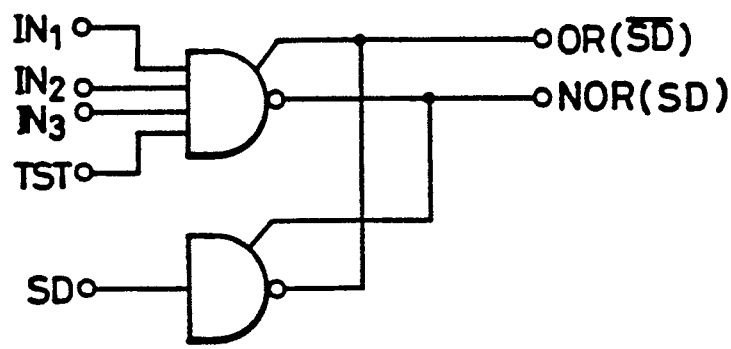
FIG. 2 is an equivalent circuit diagram representing the circuit of FIG. 1 by use of logic symbols.

FIG. 2 shows an equivalent circuit representing the input circuit of FIG. 1 by use of logic symbols.

As can be seen from the configuration of FIG. 2, the circuit of the embodiment inhibits the inputs of the input signals $Vin_1$ to $Vin_3$ in response to the control signal TST, and in place thereof, enables to input the secondary input signal SD from another input terminal. That is, without disposing a switching circuit other than the input circuit are used as switching means, test signals for testing the internal logic circuit can be delivered from the input circuit.

Figure 3:
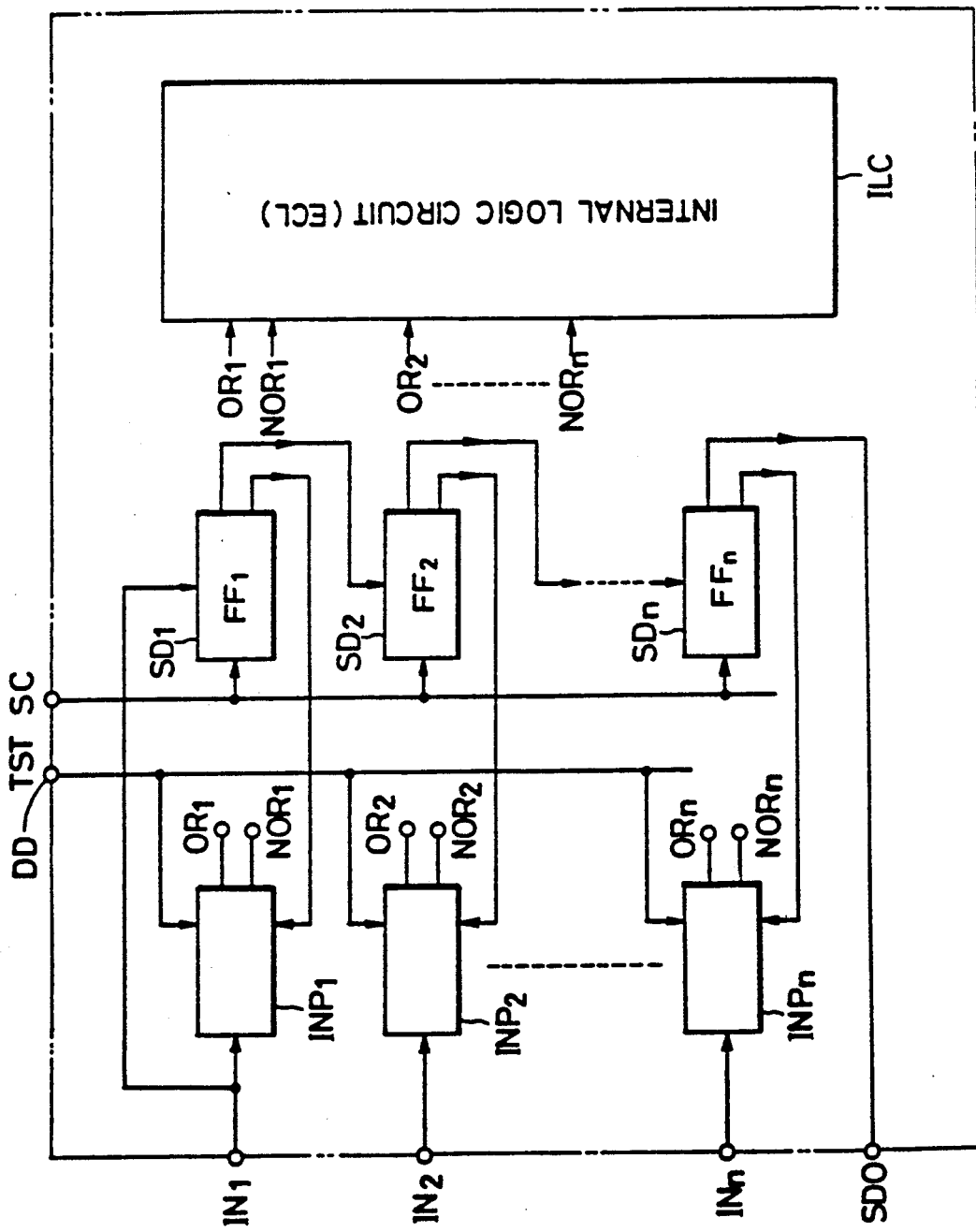
FIG. 3 is a schematic block diagram illustrating the first embodiment of a diagnosis circuit employing the input circuit of FIG. 1 according to the present invention.

FIG. 3 next shows an embodiment of a diagnosis circuit of a logic LSI having an input circuit configured as described above.

The internal logic circuit of the logic LSI of this embodiment includes a lot of standard logic circuits such as logic gate circuits and flip-flop circuits. Furthermore, there are provided many external input/output terminals such as external terminals to supply a power source voltage. As shown in FIG. 1, input circuits are respectively provided corresponding to the external input/output terminals.

In FIG. 3, input circuits $INP_1$, $INP_2$, ..., INPn are respectively disposed corresponding to the input terminals $IN_1$ to INn. Each input circuit INPi (i=1, 2, ..., n) is constituted with an ELC circuit including a secondary input transistor $Q_4$ as shown in FIG. 1. Furthermore, the respective OR outputs ($OR_1$ to ORn) and NOR outputs ($NOR_1$ to NORn) associated with the input circuits $INP_1$ to INPn are provided with signal lines (not shown) so as to be supplied to the input of the internal logic circuit (ILC).

Moreover, the input terminal (the base terminal of the transistor $Q_2$) of the input circuits $INP_1$ to INPn is supplied with a test signal TST fed from an external control terminal DD such that the input state is controlled depending on the common control signal TST.

Furthermore, flip-flops $FF_1$, $FF_2$, ..., FFn are respectively disposed corresponding to the input terminals $IN_1$ to INn so as to be connected in series, thereby constituting a shift register. In addition, data kept in the respective flip-flops $FF_1$ to FFn are to be supplied to the secondary input terminal (the base terminal of the transistor $Q_4$) of the corresponding input circuits $INP_1$ to INPn. Moreover, the flip-flop $FF_1$ in the first stage of the flip-flops above is supplied with a signal received by the input terminal $IN_1$ and the signal is then sequentially transferred in synchronism with a shift clock fed from an external device. SDO indicates a terminal disposed to output scan data transferred through the flip-flops $FF_1$ to FFn to an external device of the semiconductor chip.

In the logic LSI, when the test control signal TST applied from the external terminal DD is set to a high level, the input circuits $INP_1$ to INPn are prevented, as described above, from receiving the input signals from the input terminals $IN_1$ to INn, and in place thereof, receive a signal from the secondary input terminal to effect an operation thereof. Consequently, test data is sequentially supplied to the input terminal $IN_1$ so as to cause a shift operation in the flip-flops $FF_1$ to FFn by use of the shift clock SC. When data is arranged in each flip-flop, as a result, the data $SD_1$ to SDn respectively kept therein are transferred to the input circuits $INP_1$ to INPn. The test data set to the flip-flops $FF_1$ to FFn are then fed via the respective input circuits to the internal logic circuit (ILC), which enables to test the ILC without necessitating to input test data through all of the input terminals.

On the other hand, in an ordinary operation, when the external terminal DD is fixed to a low level, the input control transistor $Q_2$ related to the input circuits $INP_1$ to INPn the input circuits are cut off and hence is set to a state in which an input signal can be received. In this situation, consequently, if input signals Vin are supplied from the input terminals $IN_1$ to INn, the inherent logic operation can be effected.

In the embodiment described above, a shift register is constituted by connecting in series the flip-flops disposed corresponding in number to the respective input pins or input circuits, and at the same time, each input circuit is configured by means of an ECL circuit. The ECL circuit includes therein a second reference transistor connected between a constant current source and a common emitter terminal of input transistors and a secondary input transistor connected in parallel to the secondary reference transistor in a common emitter fashion. The secondary input transistor has a collector terminal coupled to a collector terminal of a first reference transistor of the ECL circuit and a control terminal to be supplied with data kept in a flip-flop corresponding thereto. As a consequence, when a control signal is inputted to one of a plurality of input transistors commonly coupled via the emitter to the first reference transistor so as to prevent a change-over of the current path associated with an input signal, and in place thereof, the change-over of the current path can be effected between the second reference transistor and the secondary input transistor commonly connected through the emitter thereto, which leads to an effect that without connecting the probe to each terminal of the LSI, test signals can be supplied from some terminals thereof via all of the input circuits to the internal circuit, thereby accomplishing a diagnosis of the LSI.

Figure 4:
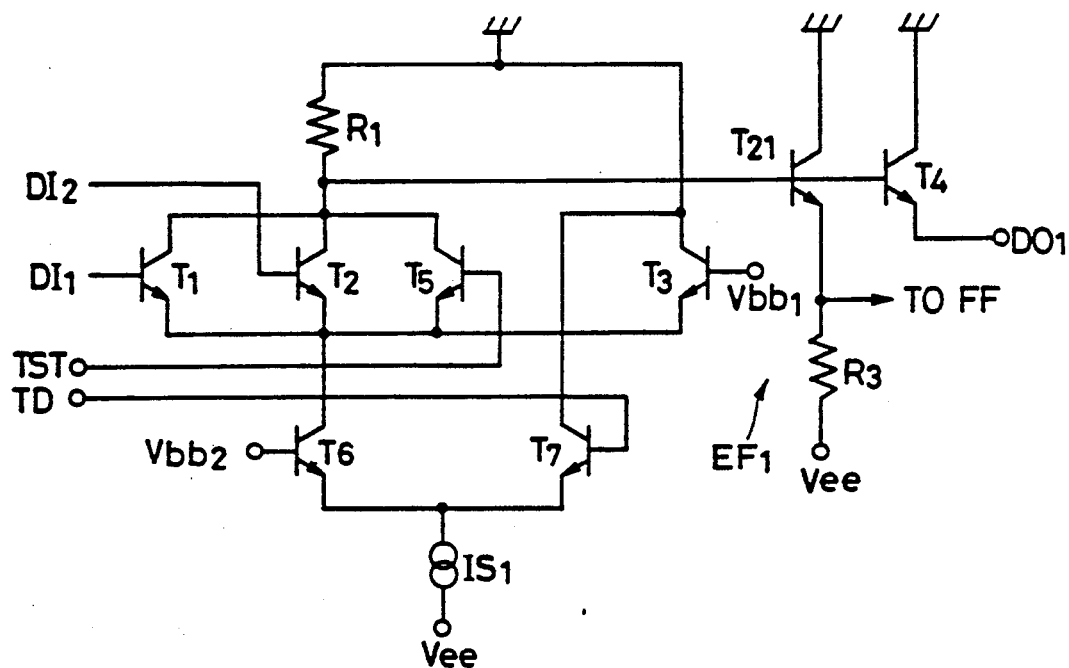
FIG. 4 is a circuit diagram schematically depicting an embodiment of an output circuit of a logic LSI to which the present invention is applied.

FIG. 4 shows a schematic circuit diagram of an embodiment of an output circuit suitable for a logic LSI including a diagnosis circuit according to the first embodiment.

The output circuit of the embodiment of FIG. 4 includes transistors T1 and T2 in a parallel configuration in which the respective collectors and emitters are commonly connected to each other and logic input signals DI1 and DI2 are supplied to the gates thereof, respectively. The logic input signals DI1 and DI2 respectively supplied to the bases of the transistors T1 and T2 include, for example, an output signal and an output control signal. In parallel to the transistors T1 and T2, there is disposed a transistor T5 having a base to receive a test control signal TST. The test control signal TST supplied to the base of the transistor T5 is set to a logical high level when a test or a diagnosis is achieved on a gate array or a digital device including the gate array. Furthermore, the test control signal TST is commonly supplied to other output circuits disposed in the gate array. Although not particularly limited to, in a case where a predetermined test/diagnosis function is not provided for the gate array, an ordinary input signal may be supplied in place of the test control signal TST.

Between the common collector of the transistors T1, T2, and T5 and a ground potential of the circuit, there is disposed a load resistor R1. Although not limited thereto, the load resistor R1 is formed with a polycrystalline silicon layer. Between the common emitter of the transistors T1, T2, and T5 and a ground potential of the circuit, there is disposed a transistor T3 having a base receiving a first reference potential Vbb1. These transistors T1–T3 and T5 constitute a current switch circuit of which the first reference voltage Vbb1 is a logical threshold level.

These transistors T1–T3 and T5 are supplied with an operation current from a constant current source IS1 via a transistor T6. A second reference voltage Vbb2 is applied to the base of the transistor T6. Between the constant current source IS1 and the collector of the transistor T3, there is disposed a transistor T7 having a base receiving a test data signal TD. The test data signal TD supplied to the base of the transistor T7 is, although not limited to, commonly supplied to other output circuits disposed in the gate array in some cases. Furthermore, in a case where a predetermined test/diagnosis function is not provided for the gate array, an ordinary logic input signal may be inputted in place of the test data signal TD. It is to be appreciated that the emitters of the transistors T6–T7 are commonly connected and the constant current source IS1 is located between the common emitter and the power source voltage Vee of the circuit. The transistors T6–T7 constitute a current switch circuit in which the second reference potential Vbb2 is a logic threshold level.

An output transistor T4 is disposed between an external terminal DO1 for an output and a ground potential of the circuit. The transistor T4 has a base connected to the commonly connected collectors of the parallel transistors T1–T2 and the transistor T5. The external output terminal DO1, although not limited thereto, is commonly connected to other external output terminals, and a load resistor is disposed between these external output terminals commonly connected and the power source voltage Vee. This provision enables an output signal delivered from these external output terminals to be supplied through a wired OR configuration.

Moreover, the output circuit of this embodiment includes, in order to enable an output signal therefrom to be transferred to flip-flops constituting a shift register for a test, an emitter follower EF1 comprising a transistor T21 having a base receiving the same signal as that of the output transistor T4 and an emitter resistor R3.

The output circuit of FIG. 4 functions as an output circuit of a type of a NOR logic gate through the following operations. That is, in an ordinary operation mode excepting the mode associated with a test and diagnosis, the test control signal TST is set to a low level corresponding to a voltage lower than the first reference voltage Vbb1, and the test data signal TD is set to a low level corresponding to a voltage lower than the second reference potential Vbb2. Consequently, the transistors T5 and T7 are set to the cut-off state and the transistor T6 is contrarily turned on. Furthermore, the transistors T1-T2 and T3 change the respective states depending on the logic input signals DI1 and DI2.

In other words, when one of the logic input signals DI1 and DI2 is at a high level associated with a voltage higher than the first reference potential Vbb1, the transistor T1 or T2 receiving the high-level logic input signal on the base thereof is turned on and the transistor T3 is set to the cut-off state. This causes the potential of the common collector of the transistors T1-T2 and T5 to be set to the low level and the output transistor T4 to be set to the cut-off state. As a result, the level of the external output terminal DO1 is set to the logical low level under a condition that the output transistors of the other external output terminals undergone the wired OR operation are turned off.

When both logical input signals DI1-DI2 are at the low level corresponding to a potential lower than the first reference potential Vbb1, the transistors T1-T2 are set to the cut-off state and the transistor T3 is contrarily turned on. This causes the potential of common collector of the transistors T1, T2, and T5 to be at a high level and the output transistor T4 to be turned on. As a consequence, the external output terminal DO1 is supplied with an output current via the transistor T4, and the level of the external output terminal DO1 is set to a logical high level regardless of the states of the output transistors of the other external output terminals undergone the wired OR operation.

As can be seen from the description above, the output circuit of FIG. 4 functions, under a condition that the test control signal TST and the test data signal TD are both at the logical low level, as an output circuit of the type of a NOR logic gate in which the output signal level do1 of the external output terminal DO1 is $$do1 = \overline{DI1 \cdot DI2} \cdot$$
$$= \overline{DI1} + \overline{DI2}.$$

On the other hand, when the test control signal TST is at a logical high level associated with a voltage higher than the first reference potential Vbb1, the transistors T5 and T3 are set to the on state and the cut-off state, respectively. Furthermore, since the transistor T5 is turned on, the logic input signals DI1 and DI2 do not logically influence the output signals delivered from the output circuit. In this case, if the test data signal TD is at a low level associated with a potential lower than the second reference potential Vbb2, the transistor T7 is set to the cut-off state and the transistor T6 is turned on. As a result, the common collector of the transistors T1-T2 and T5 is set to a logical low level and the output transistor T4 is set the cut-off state. Consequently, the level of the external output terminal DO1 is set to a logical low level under a condition that the output transistors of the other external terminals undergone the wired OR operation are similarly turned off.

In addition, when the test control signal TST is at a logical high level and the test data signal TD is at a high level associated with a potential higher than the second reference potential Vbb2, the transistor T7 is turned on and the transistor T6 is contrarily set to the cut-off state. This causes the common collector of the transistors T1-T2 and T5 to be set to a high level and the output transistor T4 to be turned on. As a result, the external output terminal DO1 is supplied with an output current via the transistor T4 and the level of the external output terminal DO1 is set to a logical high level regardless of the states of the output transistors of the other external output terminals.

Furthermore, in the output circuit of the embodiment, in addition to the output transistor T4, an emitter follower EF1 is disposed to supply the same output data to the scan flip-flop, the level of the output data can be obtained by the scan flip-flop regardless of the load connection state of the external output terminal DO1, namely, the magnitude of the load connected thereto.

Figure 5:
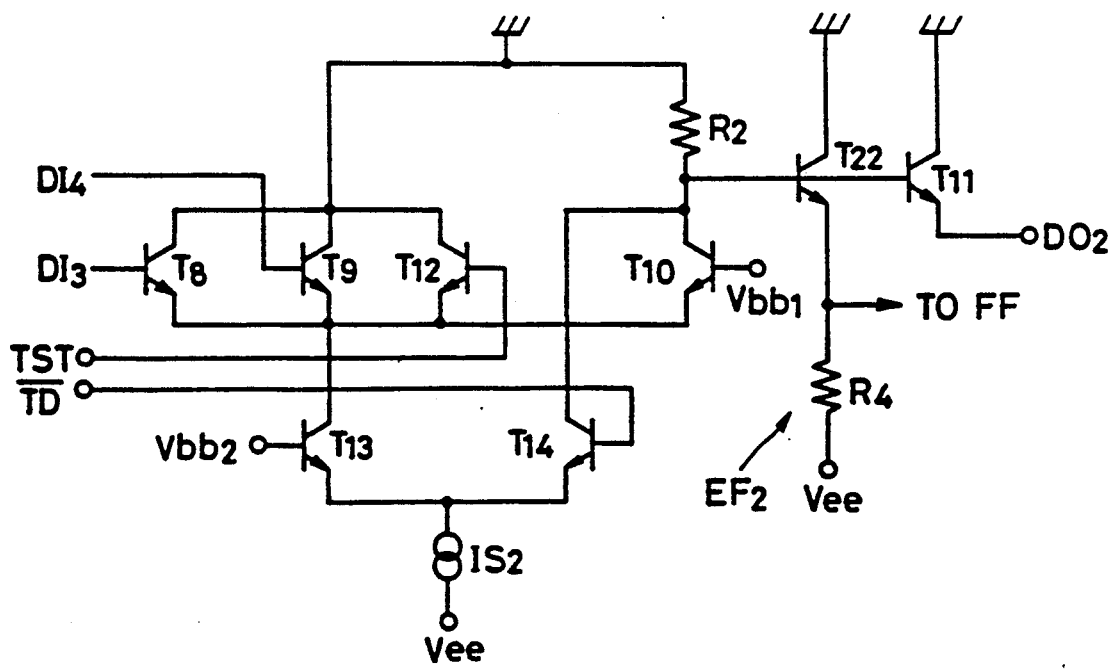
FIG. 5 is a schematic circuit diagram showing an alternative embodiment of the output circuit of a logic LSI to which the present invention is applied.

FIG. 5 shows a circuit diagram of an alternative embodiment of the output circuit suitable for the logic LSI according to the present embodiment. The configuration of the output circuit of this embodiment is basically the same as that of FIG. 4. In the following description, the duplicated components as those of the embodiment of FIG. 4 will not be described.

In FIG. 5, the logical input signals DI3 and DI4 are supplied to the bases of the transistors T8 and T9, respectively. Moreover, the test control signal TST is fed to the base of the transistor T12, whereas the base of the transistor T14 is supplied with a reverse test data signal $\overline{TD}$. In the output circuit of this embodiment, the test control signal TST and the reverse test data signal $\overline{TD}$ are both set to the low level in an ordinary operation mode. The common collector of the transistors T8, T9 and T12 is directly coupled to a ground potential of the circuit. Between the collector of the transistor T10 having a base receiving the first reference potential Vbb1 and the ground potential of the circuit, there is disposed a load resistor R2. The second reference potential Vbb2 is applied to the base of the transistor T13.

The collector of the transistor T10 is coupled to the collector of the transistor T14 and the base of the output transistor T11.

Furthermore, in order to supply the same logical level as that of the output signal to the shift register for the test, there is provided an emitter follower EF2 including a transistor T22 and an emitter resistor R4.

The output circuit of FIG. 5 functions as an OR logic gate through an operation similar to that of the output circuit of FIG. 4.

That is, the output circuit of FIG. 5 functions, under a condition that the test control signal TST and the reverse test data signal $\overline{TD}$ are both at the logical low level, as an output circuit of the type of an OR logical gate for which the output signal level do2 of the external output terminal DO2 is do2 = DI3 + DI4.

On the other hand, in a case where the test control signal is at a high level associated with a potential higher than the first reference potential Vbb1, the operation is logically reversed as compared with that of the embodiment of FIG. 5, namely, when the reverse test data signal $\overline{TD}$ is at a high level associated with a potential higher than the second reference potential Vbb2, the external output terminal D02 is set to the logical low level; whereas, when the reverse test data signal $\overline{TD}$ is at a low level associated with a potential lower than the second reference potential Vbb2, the external output terminal D02 is set to the logical high level.

As described above, in the output circuit of the gate array of this embodiment, in parallel with the respective parallel transistor having a base receiving a corresponding logical input signal, there is disposed a first transistor having a base receiving the test control signal TST. These transistors configure a current switch circuit together with a second transistor having a base receiving the first reference voltage Vbb1. Moreover, the parallel transistor and the first transistor are connected to the constant current source via a third transistor having a base receiving the second reference potential Vbb2; furthermore, between the constant current source and the collector of the second transistor, there is disposed a fourth transistor having a base receiving the test data signal. As a consequence, when the test control signal TST and the test data signal $\overline{TD}$ are both at the logical low level, the output circuit of the embodiment functions as an output circuit of the type of an ordinary NOR logic gate or an ordinary OR logic gate; whereas, in a case of the test/diagnosis mode where the test control signal is set to the logical high level, the external output terminal can be fixedly set to a level corresponding to the test data signal TD. Consequently, also in a case where a plurality of LSI's such as the gate array IC's are mounted on a board, the output signals from the LSI in the preceding stage can be fixed without using many test pins, thereby supplying the predetermined test data to the LSI in the succeeding stage. As a result, the test and the diagnosis of the digital device configured on a board can be efficiently effected.

Figure 6:
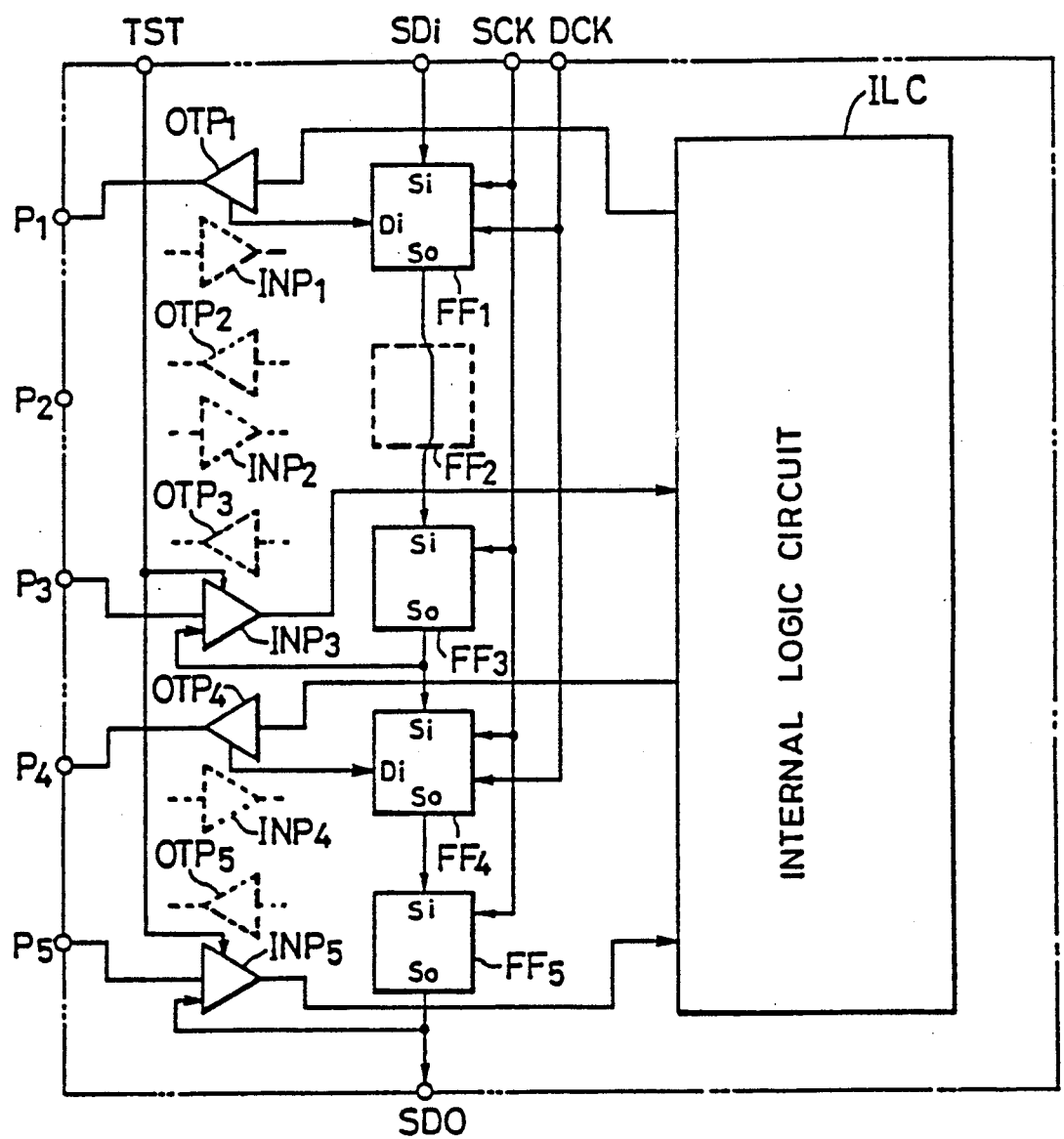
FIG. 6 is a block diagram schematically showing an embodiment of a diagnosis circuit in a case where the present invention is applied to a logic LSI employing the input circuit of FIG. 1 and the output circuit of FIG. 4.

FIG. 6 shows a schematic circuit diagram of an embodiment in a case where a diagnosis circuit employing the input circuit of FIGS. 1 or 2 and the output circuit of FIGS. 4 or 5 are applied to a gate array according to the present invention.

Corresponding to the individual external terminals of the LSI, namely, input/output pins $P_1, P_2, \ldots, P_n$, there are provided a plurality of individual sets each including an input circuit INP, an output circuit OTP and a scan flip-flop FF. In this configuration, depending on whether the associated pin of an individual set is set as an input pin or as an output pin, a desired circuit is selected from the three circuits above such that at a wiring operation according to the master slice method, a connection is established between the pin and either one of the input circuit INP and the output circuit OTP. Furthermore, amongst the input/output pins of the LSI are included pins to be used as a power supply pin, for example, and an idle pin, which are not connected to any input/output circuits.

In the example of FIG. 6, the output circuit OTP is connected to the pins $P_1$ and $P_4$, the input circuit INP is connected to the pins $P_3$ and $P_5$, and the pin $P_2$ is used as an idle pin or as a power supply pin.

In order to constitute a shift register for a diagnosis, the scan flip-flops $FF_1$ to $FF_n$ are connected to each other in series and the output terminal of each emitter follower (FIG. 4) of the output circuits $OTP_1$ and $OTP_4$ respectively corresponding to the pins $P_1$ and $P_4$ is connected to each data input terminal Di of the associated flip-flops $FF_1$ and $FF_4$. Moreover, the scan data input terminals Si of the input circuit $INP_3$ and $INP_5$ corresponding to the pins $P_3$ and $P_5$ are coupled to the data output terminals So respectively of the corresponding scan flip-flops $FF_3$ and $FF_5$. However, the flip-flop $FF_2$ associated with the pin $P_2$ used as an idle pin is connected neither to the input circuit $INP_2$ nor to the output circuit $OTP_2$. Furthermore, in order to skip the flip-flop $FF_2$, the data output terminal So of the flip-flop $FF_1$ and the data input terminal Si of the flip-flop $FF_3$ are directly wired.

The shift register configured with the flip-flops $FF_1$ to $FF_n$ is enabled to effect an operation thereof in response to a scan clock supplied thereto from an external device.

In a diagnosis, test data is supplied to the scan data input terminals SDi in a serial fashion so as to be shifted into the respective flip-flops FF's in response to the scan clock SCK. In a state where each flip-flop is loaded with the desired test data, when the test control signal TST is set to the high level, the respective test data can be inputted to the corresponding input circuits at a time, thereby transferring the test data via the input circuits to the internal logic circuit (ILC). Incidentally, in this embodiment, the flip-flops corresponding to the input circuits as well as the flip-flops associated with the output circuits are connected to constitute a shift register. Consequently when the test data is desired to be fed through the terminals SDi, dummy data must be inputted for the bits corresponding to the output circuits. For the flip-flops loaded with such dummy data, the test data transfer to the corresponding input circuits is not accomplished. This is because the input circuits to which the test data is to be transferred are not connected thereto.

On the other hand, in a case where the data delivered from the output circuits are to be scanned out through the test shift register, a common data latch clock DCK is externally supplied via the respective flip-flops $FF_1$ to $FF_n$. The data being outputted to the output circuits $OTP_1$ and $OTP_4$ are then fetched into the flip-flops $FF_1$ and $FF_4$, respectively. Next, when the scan clock SCK is supplied, the data latched into the shift register is shifted so as to be delivered from the scan data output terminal SDO. As a result, since the test results of the internal logic circuit can be outputted from a pin to an external device of the integrated circuit, the number of terminals to be connected by means of the probe pins for a test is reduced.

As described above, in a logic LSI in which the pin usage is arbitrarily changed, a shift register scanning the test data can be readily structured only through a slight change of the wirings according to the master slice method.

Incidentally, in the embodiment above, although a shift register is constituted for a test without discriminating the flip-flops associated with the input, the different shift registers may be configured as shown in the embodiment of FIG. 3, such that a shift register comprising the flip-flops associated with the input circuits and a shift register including the flip-flops corresponding to the input circuits. However, according to a manner in which the shift register is formed in a combination of the flip-flops associated with both of the input and output circuits as shown in the embodiment of FIG. 6, there is attained an effect that the length of the wirings for the scan path is minimized.

Although description has not been given of the structure of the flip-flops constituting the test shift register in conjunction with the embodiment above, more concretely, in order to prevent the racing of the scan data due to the clock skew, the flip-flops $FF_1$ to $FF_n$ each are structured in the master-slave configuration.

Moreover, in the actual test, there can be considered various kinds of applications, for example, an application in which pulses are inputted from an input circuit selected from n input circuits with the test data of the other n−1 input circuits remaining unchanged or an application in which while inputting a test pattern via the input circuits to an internal logic circuit, the next test pattern is scanned in to the shift register.

In order to configure a diagnosis circuit capable of coping with such various kinds of test applications, between the slave flip-flop of the flip-flop FFi in the master-slave structure and the input circuit INPi, there is desirably provided an auxiliary flip-flop to effect a data latch operation such that the test data thus scanned in to the test shift register is temporarily latched into the auxiliary flip-flop so as to be thereafter transferred to the internal logic circuit in response to a test control signal TST supplied to the input circuit.

Through developing the concept above, if the input circuit employed includes a latch function, it can readily be understood that the auxiliary flip-flop need not be disposed between the shift register and the input circuit.

Next, a description will be given of an embodiment in a case where a gate array having a diagnosis function is implemented by use of an input circuit of a type including a latch function. Furthermore, with consideration to an easiness of the testing in an actual case, the latch function need not be provided for all input pins, namely, when the latch function is not disposed, the test pattern can be reduced in some cases. As a specific example of such pins, there is a pin directly inputting a timing signal (clock) to an internal logic circuit and a pin to be brought into contact with a probe during a test so as to keep the same level thereof while the scan-in operation is taking place.

In the embodiment below, consequently, there are provided three kinds of input circuits including an input circuit as an ordinary input buffer directly supplying a signal from an input pin to an internal logic, an input circuit which has a latch function and which is not connected to the scan flip-flops for the test, and an input circuit which has a latch circuit and which is connected to the scan flip-flops, thereby configuring a diagnosis circuit with a combination of these input circuits so as to improve the test efficiency.

Figure 7:
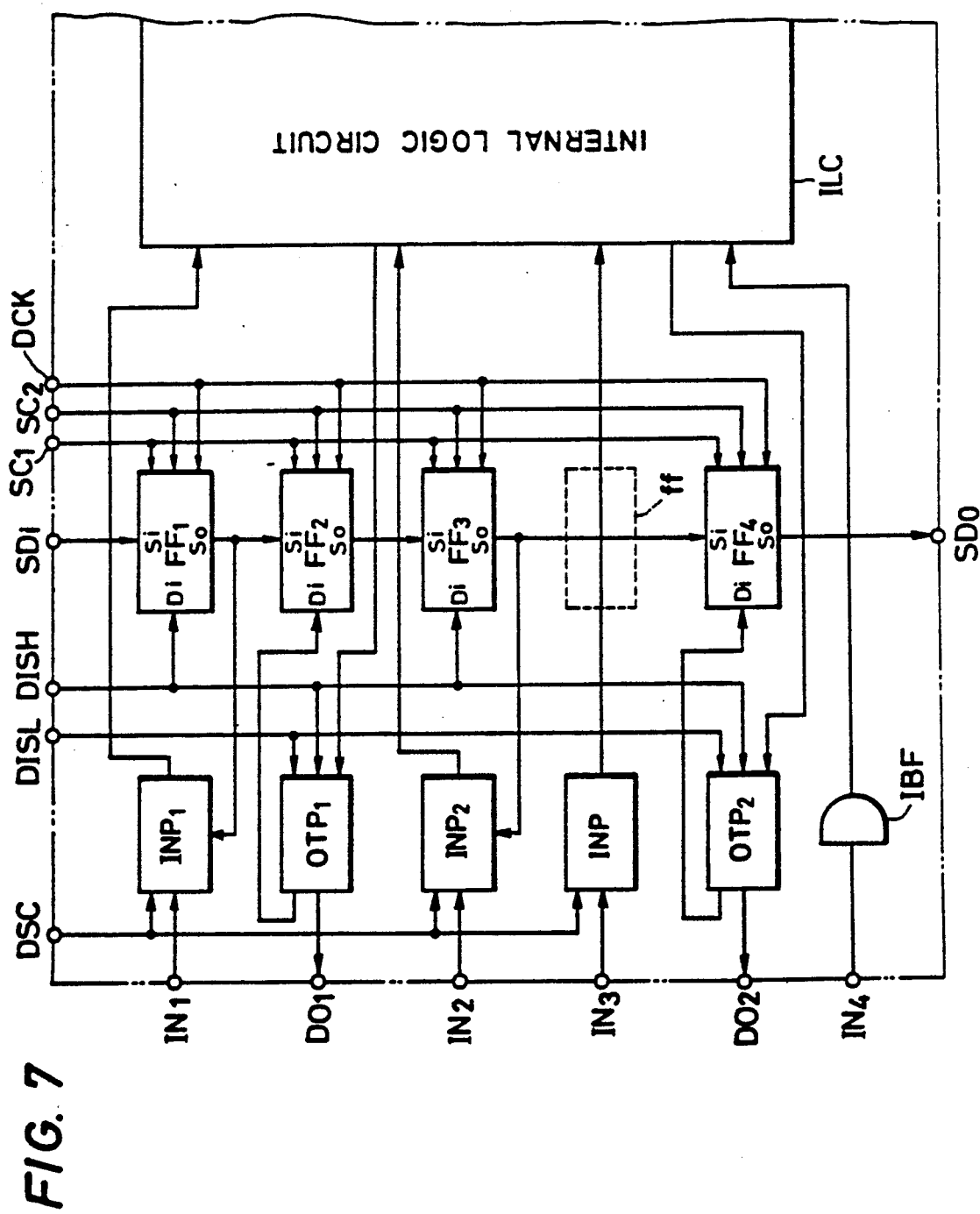
FIG. 7 is a schematic block diagram illustrating the third embodiment of the diagnosis circuit according to the present invention.

FIG. 7 shows an example of the configuration of a diagnosis circuit employing an input circuit having a latch function.

In this diagram, reference numeral IBF indicates an ordinary input buffer not having a latch function. An input pin $IN_4$ connected to the buffer IBF is supplied with a timing signal to be directly inputted to the internal logic circuit ILC. The timing signals include one to be used in a test and one to be supplied in an ordinary operation. As a consequence, in such cases, the input pins and the input buffers must be separately disposed, respectively.

Furthermore, in the configuration of FIG. 7, reference numeral INP denotes an input circuit which has a latch function and which is not connected to the scan flip-flop FF. In the gate array, a flip-flop is beforehand disposed for each input/output pin; however, the flip-flops arranged corresponding to the input circuit INP and the input buffer IBF are not connected therebetween (as indicated with dotted lines ff in FIG. 7), namely, a connection is established only to the internal logic circuit, ILC.

Moreover, in FIG. 7, reference numerals $INP_1$ and $INP_2$ designate input circuits each having a latch function and being connected to a scan flip-flop corresponding thereto. The input circuit of this type comprises two data input terminals including a terminal connected to the input pins $IN_1$-$IN_2$ and a pin linked to a scan out terminals So of the scan flip-flops $FF_1$ and $FF_3$. As will be described later in this text, when the clock supplied from an external device is fixed to a low level, the input circuit $INP_1$-$INP_2$ are set to the data through mode so as to operate as input buffers to supply signals applied to the input pins $IN_1$-$IN_2$ directly to the internal logic circuit, ILC. When the clock DSC is set to a high level, data of the flip-flops $FF_1$ and $FF_3$ being supplied at the moment to the second data input terminal is latched into the input circuit $INP_1$ or $INP_2$. Incidentally, in this situation (in a test), the input pins $IN_1$-$IN_2$ are pulled down (or pulled up) by a high resistance so as to prevent the signal level supplied to the first data input terminal from being latched.

On the other hand, in the constitution of FIG. 7, reference numerals OTP, to $OTP_2$ denote output circuits having two output terminals including a terminal connected to external output pins DO1-DO2 and a terminal coupled to data input terminals Di of the corresponding scan flip-flops $FF_2$-$FF_4$. Moreover, the output circuits $OTP_1$-$OTP_2$ are so configured to forcibly fix the output signals therefrom to the low level or the high level depending on the control signal DISL or DISH supplied from an external device. When the output signals are set to the low or high level, the measurement of the DC level of the output signals as well as the measurement of the leakage current are facilitated.

The scan flip-flops $FF_1$-$FF_4$ respectively connected to the input circuits $INP_1$-$INP_2$ and the output circuits $OTP_1$-$OTP_2$ configure a shift register when the respective scan out terminals So are connected to the corresponding scan-in terminals Si of the flip-flops in the succeeding stage. Furthermore, although now shown in the diagram, the flip-flops $FF_1$-$FF_4$ are structured in the master-slave configuration so as to effect a scan operation in response to the two-phase scan clocks SC1 and SC2, thereby shifting the data kept therein. Moreover, the flip-flops $FF_2$ and $FF_4$ connected to the output circuits are so configured to latch output data from the corresponding output circuits depending on the clock DCK supplied form an external circuit.

The diagnosis circuit of the embodiment above results in the following effects.

That is, in a logic LSI like a gate array, there is present several hundred input/output pads including several pads dedicated to the test. In a test, it is impossible to bring all several hundred of the pads into contact with the probe pins; however, for the test, the probe pins need not be connected only to the pads dedicated to the test, namely, the number of probes can be increased in a possible range. For those input pads to which the probes can be contacted, the scan flip-flop is not connected to the input circuit so as to directly input the test data from the probe, thereby minimizing the scan path of the shift register. This provision enables to reduce the period of time necessary for the scan-in and scan-out operations. Furthermore, since there is provided an input circuit through which a signal can be directly inputted to the internal logic, the timing signal can be directly supplied from a tester, which minimizes the size of the test pattern.

In addition, for the pins directly inputting signals from the tester, when the scan flip-flops are reduced, the areas dedicated to the diagnosis circuit can be decreased and hence the chip size is minimized.

Furthermore, in the diagnosis circuit of FIG. 7, the following features are provided to readily detect a failure of a scan flip-flop and a location thereof.

Namely, the provisions are implemented by use of a fact that the diagnosis circuit of this embodiment includes a function to enable the output circuit to fix the output therefrom to a low level or a high level depending on the control signal DISL or DISH from an external device. The data input terminals Di of the scan flip-flops $FF_1-FF_3$ associated with the input circuits should be idle terminals not to be connected to any circuits when viewed from the inherent function thereof to shift the test data. In this embodiment, however, these free data input terminals Di are supplied with the control signal DISH to forcibly fix the outputs therefrom to the high level.

As a consequence, when it is desired to detect a condition of a so-called low stack flip-flop in which only data "0" is detected even when data "1" is beforehand latched, the control signal DISH is set to the high level so as to fix the outputs from the all output circuits to the high level. Thereafter, a clock DCK is inputted to fetch the output data into the scan flip-flops such as $FF_2$ and $FF_4$. In this operation, the flip-flops such as $FF_1-FF_3$ corresponding to the input circuits fetches the high level of the control signal DISH applied to the data input terminals Di in response to the clock DCK. As a result, data "1" is loaded in all flip-flops $FF_1-FF_4$ constituting the shift register. When the flip-flops $FF_1-FF_4$ includes a low stack flip-flop, only the output from the failed flip-flop is set to the high level; and hence when the data kept in all flip-flops are scanned out in response to the scan clocks SC1 and SC2, the scan output data SDo changes from the high level to the low level when the clocks of which the number is associated with the failed flip-flop is supplied. Consequently, existence of the low stack flip-flop can be detected by monitoring the scan out data, and the position of the failed flip-flop can be known by counting the number of clocks at the moment.

On the other hand, when it is desired to detect a condition of so-called high stack flip-flop in which only data "1" is detected even when data "0" is beforehand latched, the control signal DISL is set to the high level so as to fix the outputs from the all output circuits to the high level. Thereafter, a clock DCK is inputted to fetch the output data into the scan flip-flops such as $FF_2$ and $FF_4$. In this operation, the flip-flops such as $FF_1-FF_3$ corresponding to the input circuits fetches the low level of the control signal DISH applied to the data input terminals Di in response to the clock DCK. As a result, data "0" is loaded in all flip-flops $FF_1-FF_4$ constituting the shift register. When the flip-flops $FF_1-FF_4$ includes a high stack flip-flop, only the output from the failed flip-flop is set to the high level; and hence when the data kept in all flip-flops are scanned out in response to the scan clocks SC1 and SC2, the scan output data SDo changes from the low level to the high level when the clocks of which the number is associated with the failed flip-flop is supplied. Consequently, existence of the low stack flip-flop can be detected by monitoring the scan out data, and the position of the failed flip-flop can be known by counting the number of clocks at the moment.

Incidentally, in the embodiment above, the external control signal forcibly fixing the outputs from the output circuits is used to detect the low stack flip-flop and the high stack flip-flop. However, by use of the flip-flops including a set/reset function, wherein all flip-flops are set or reset for a test and then the scan clocks SC1-SC2 are inputted so as to scan out all data of the shift register, the low stack flip-flop and the high stack flip-flop can be detected.

Incidentally, the flip-flop having the set/reset function can be easily implemented by disposing a third current switch circuit between the common emitter terminal of the transistors $Q_{33}-Q_{35}$ and the constant current source CC1 in the flip-flop cirucits of FIG. 10, which will be described later, the third current switch circuit including transistors having bases to which a reference potential and a set signal or a reset signal are applied and having emitters commonly connected.

Figure 8:
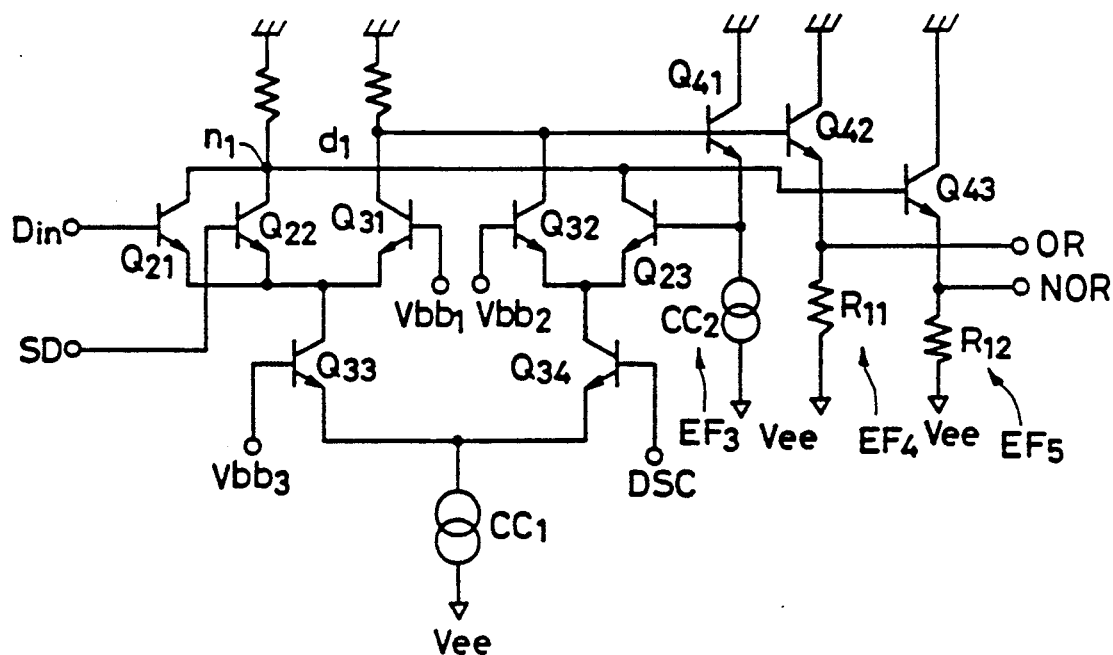
FIG. 8 is a circuit diagram schematically depicting an example of an input circuit applied to a logic LSI having the third embodiment of the diagnosis circuit.

FIG. 8 shows an example of a specific circuit configuration of an input circuit INP which has a latch function and which is not connected to a scan flip-flop.

In the input circuit of this embodiment, a transistor $Q_{21}$ having a base terminal receiving a data signal Din from an input pin and a transistor $Q_{22}$ having a base terminal receiving scan data SD from a scan flip-flop are connected in parallel. These parallel transistors $Q_{21}$ and $Q_{22}$ and a transistor $Q_{31}$ having a base terminal receiving a reference voltage $Vbb_1$ are connected through a common emitter so as to form an ECL cicuit.

Between the transistors $Q_{21}$ and $Q_{23}$ and between the transistors $Q_{31}$ and $Q_{32}$, there are respectively established common collector connections, and the transistors $Q_{23}$ and $Q_{32}$ are linked through a common emitter connection. The common emitter terminal of the transistor $Q_{21}$ and $Q_{31}$ and the common emitter terminal of the transistors $Q_{23}$ and $Q_{32}$ are respectively connected to the collectors of the transistors $Q_{33}$ and $Q_{34}$ having a common emitter connection therebetween. Furthermore, the common emitter terminal of the transistors $Q_{33}$ and $Q_{34}$ is connected to the constant current source $CC_1$. That is, 2-stage current change-over circuits are arranged in a vertical direction so as to form a series gate. The current change-over circuit ($Q_{33}$ and $Q_{34}$) in the second stage enables the flow of current at only one of the ECL circuits at a time including that one corresponding to the transistors $Q_{2\ 1}$, $Q_{2\ 2}$, and $Q_{3\ 1}$ and the ECL circuit comprising the transistors $Q_{23}$ and $Q_{32}$ in accordance with the circuit to which the current is supplied, thereby effecting the latch and hold operations. In order to control the current change-over circuit ($Q_{33}$ and $Q_{34}$), the base of the transistor $Q_{34}$ is supplied with a clock delivered from an external device and the base of the other transistor $Q_{33}$ is supplied with the reference voltage $V_{bb3}$.

In this embodiment, potential $D_1$ of an output node $d_1$ on the OR side of the ECL input stage is applied to an emitter follower circuit EF3 including a transistor $Q_{41}$ and a constant current source $CC_2$. The emitter follower circuit EF3 has an output applied to the base of the transistor $Q_{23}$ having the common collector connection with the transistor $Q_{21}$ and a reference potential $Vbb_2$ is applied to the base of the transistor $Q_{32}$ having the common emitter connection with the transistor $Q_{23}$.

As a result, when the current change-over circuit ($Q_{33}$ and $Q_{34}$) enables the flow of current to the side of the ECL circuit including the transistors $Q_{21}$, $Q_{22}$, and $Q_{31}$, the input data signal Din supplied to the base of the transistor $Q_{21}$ at the time and the scan data SD are logically ORed and the resultant output OR is delivered from an emitter follower EF4 comprising a transistor $Q_{42}$ connected to the collector of the transistor $Q_{31}$ and a resistor $R_{11}$. Furthermore, an emitter follower EF5 including a transistor $Q_{43}$ connected to the collector of the transistor $Q_{21}$ and a resistor $R_{12}$ outputs a NOR logic output NOR. On the other hand, when the current change-over circuit ($Q_{33}$ and $Q_{34}$) enables the flow of current to the side of the ECL circuit including the transistors $Q_{23}$ and $Q_{32}$, an output from the ECL circuit ($Q_{21}$, $Q_{22}$, and $Q_{31}$) is fed back via the emitter follower EF3 to the ECL circuit ($Q_{23}$ and $Q_{32}$). As a result, the data latched in the ECL circuit ($Q_{21}$, $Q_{22}$, and $Q_{31}$) is held therein, namely, the ECL circuit comprising the transistors $Q_{23}$ and $Q_{32}$ and the emitter follower circuit EF3 constitute a hold circuit.

Incidentally, in the input circuit of FIG. 8, when the transistor $Q_{22}$ is omitted, there is configured an input circuit which has a latch function and which is not connected to the scan flip-flop. Moreover, an input circuit not having a latch function can be constituted with an ordinary ECL gate including an ECL input circuit and an emitter follower.

Figure 9:
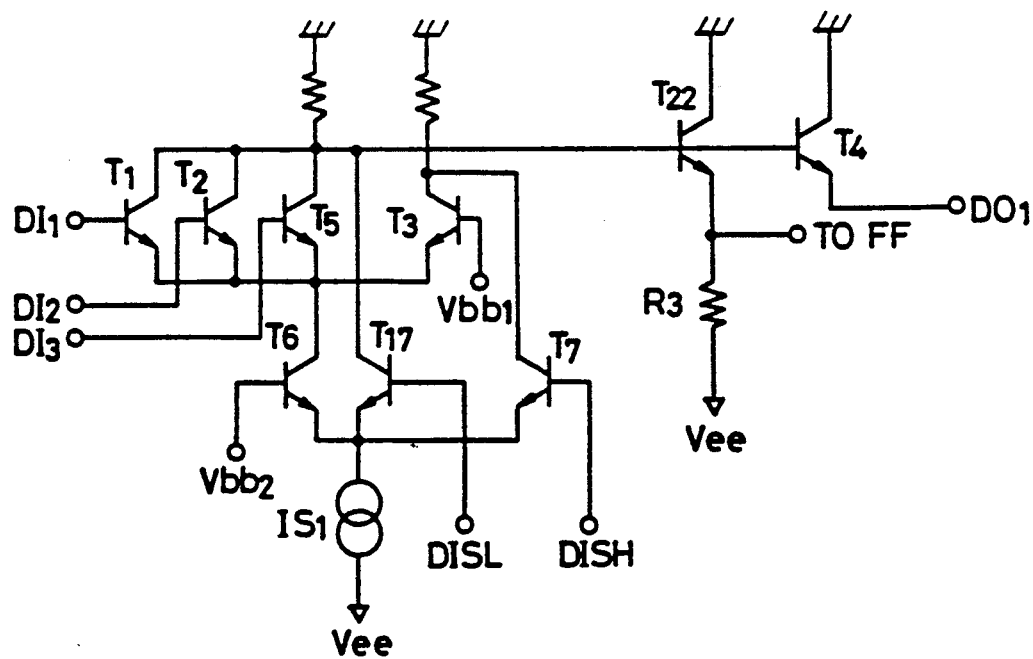
FIG. 9 is a schematic circuit diagram showing an example of an output circuit applied to a logic LSI having the third embodiment of the diagnosis circuit.

FIG. 9 shows an example of a specific circuit configuration of an output circuit suitable for a logic LSI having the diagnosis circuit of FIG. 7.

The output circuit of this embodiment has a configuration similar to that of the output circuit of FIG. 4. In the following paragraphs, only the difference therebetween will be described.

That is, first, in the output circuit of FIG. 9, the base terminal of the input transistor T5 to which the test control signal TST of FIG. 4 is inputted is supplied with a data signal DI3 outputted from a logic gate circuit in the final stage of the internal logic circuit like the other input transistors T1-T2 so as to output NORed results between the signals DI1-DI3.

The second different point resides in that in the output circuit of FIG. 7, the control signal DISH is inputted from an external circuit to the base of the transistor T7 to which the test data TD in FIG. 4 is supplied. When this control signal DISH is set to the high level, the transistor T7 is turned on, and in place thereof, the transistor T6 is turned off, which causes the potential of the common collector terminal of the transistors T1-T2 to be forcibly set to the high level regardless of the levels of the input signals DI1-DI3.

The third difference is that a new transistor T17 is connected between the common collector terminal of the transistors T1, T2, and T5 and the common emitter terminal of the transistors T6 and T7 so as to apply the control signal DISL to the base of the transistor T17. When the control signal DISL is set to the high level, under a condition that the control signal DISH is at the low level, the transistor T17 is turned on, and in place thereof, the transistor T6 is turned off, which causes the potential of the common collector terminal of the transistors T1, T2, and T5 to be forcibly set to the low level regardless of the levels of the input signals DI1-DI3, thereby fixing the output DO1 to the low level.

In the output circuit of this embodiment, in an ordinary operation, when the control signal DISH and the input terminal thereof are pulled down through a high resistance to a low level, a current is supplied through the transistor T6 in any cases so as to develop the NOR logic operation. In a case where the output signals are to be fixed to the high level or the low level in a test, either the control signal DISH or DISL is set to the high level. It inhibits setting the control signals DISH and DISL to the high level at the same time.

Figure 10:
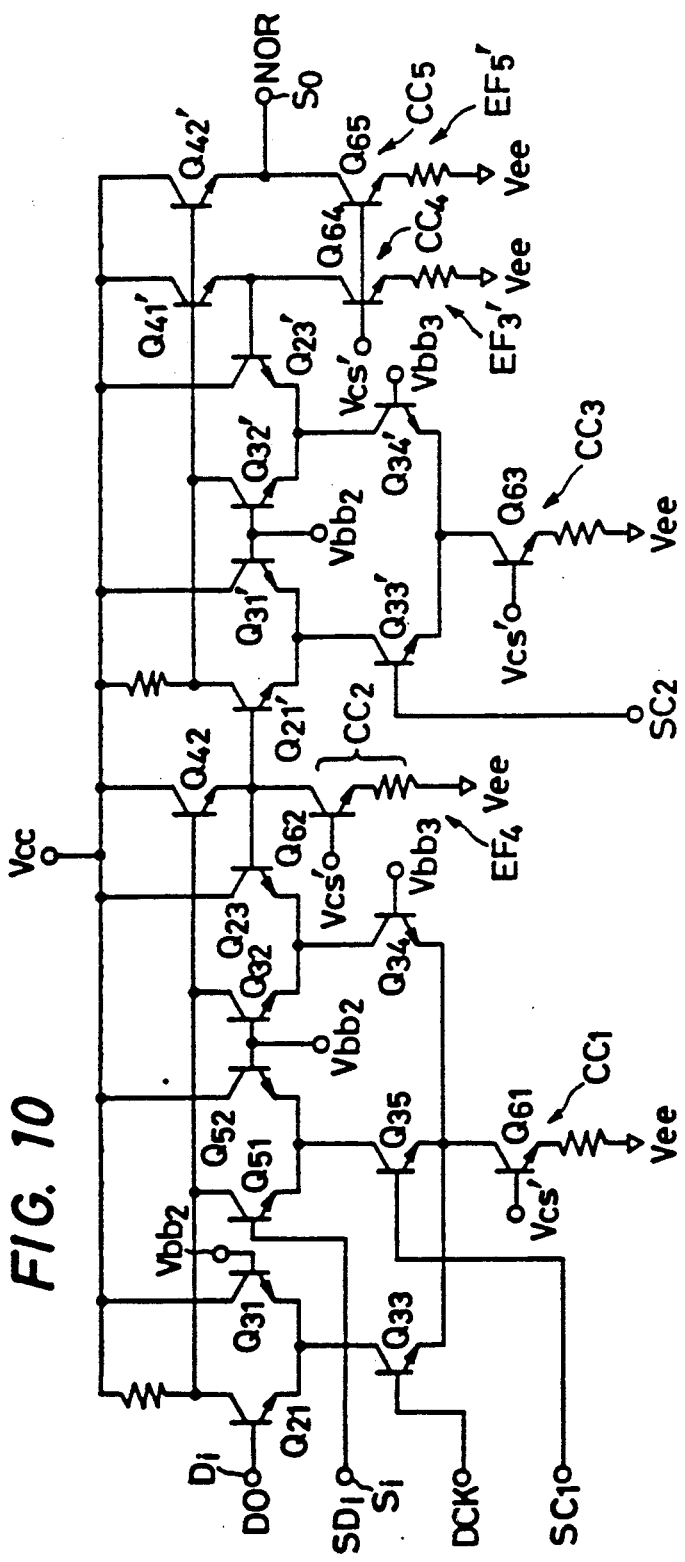
FIG. 10 is a schematic circuit diagram showing an example of a scanning flip-flop applied to a logic LSI including the third embodiment of the diagnosis circuit.

FIG. 10 shows an example of a circuit configuration of flip-flops in the master-slave configuration employed in the diagnosis circuit of FIG. 9.

The flip-flop of this embodiment includes two latches in a cascade connection, each latch having a configuration similar to that of the input circuit of the series gate type shown in FIG. 8. The latch circuit in the preceding stage is a master flip-flop M-FF and the latch circuit in the succeeding stage is a slave flip-flop S-FF.

The differences between each of these flip-flops and the circuit of FIG. 8 are as follows.

That is, in the flip-flop M-FF in the preceding stage of the circuit of FIG. 8, one of the two ECL circuits ($Q_{21}$ and $Q_{31}$ and $Q_{32}$ and $Q_{23}$) is operated when the current is changed over by the current switch ($Q_{33}$ and $Q_{34}$); whereas in the master flip-flop M-FF of this embodiment, a third ECL circuit ($Q_{51}$ and $Q_{52}$) is provided in parallel with the ECL circuits ($Q_{21}$ and $Q_{31}$ and $Q_{32}$ and $Q_{23}$) such that these three ECL circuits are coupled through a common emitter connection to form a current switch including three transistors $Q_{33}$, $Q_{34}$, and $Q_{35}$, which enables the flow of current through the one transistor which becomes conducting.

Furthermore, in the first ECL circuit ($Q_{21}$, $Q_{31}$, and $Q_{33}$), an output data signal DO from the output circuit is fed to the base of the transistor $Q_{21}$ and a clock DCK is supplied to the base of the transistor $Q_{33}$, thereby operating as a latch circuit latching thereinto the output data in synchronism with the clock DCK. Moreover, in the second ECL circuit ($Q_{51}$, $Q_{52}$, and $Q_{35}$), scan data SDi from a scan-in terminal Si is delivered to the base of the transistor $Q_{51}$ and the scan clock SC1 is supplied to the base of the transistor $Q_{35}$, thereby operating as a latch circuit latching thereinto the scan data SDi in synchronism with the scan clock SC1. The third ECL circuit ($Q_{23}$, $Q_{32}$, and $Q_{34}$) operates as a hold circuit.

In addition, in the master flip-flop M-FF of this embodiment, the emitter follower EF4 outputting an NOR logic output signal is also used as an emitter follower EF3 of the feedback operation. This is because a slave flip-flop as a load is located in the proximity thereof.

On the other hand, the configuration of the slave flip-flop S-FF is similar to that of the input circuit of FIG. 8. In this diagram, in order to clearly discriminate the master flip-flop M-FF, primes are added to the reference numerals of the corresponding transistors for the discrimination. The substantial difference is that the slave flip-flop S-FF is not provided with the emitter follower EF5 for the OR logic output. The slave flip-flop S-FF, when the reference voltage $V_{bb\,3}$ is applied to the transistor $Q_{34}'$ and the scan clock SC2 is inputted to the base of the transistor $Q_{33}'$, fetches and holds the data held in the master flip-flop M-FF in the preceding stage in synchronism with the scan clock SC2.

When the scan clocks SC1 and SC2 are of the opposite phases so as to prevent the periods of the high level from being overlapped with each other, the data received from the scan-in terminal Si cannot be directly transferred to the scan-out terminal So, thereby preventing the so-called racing.

Figure 11:
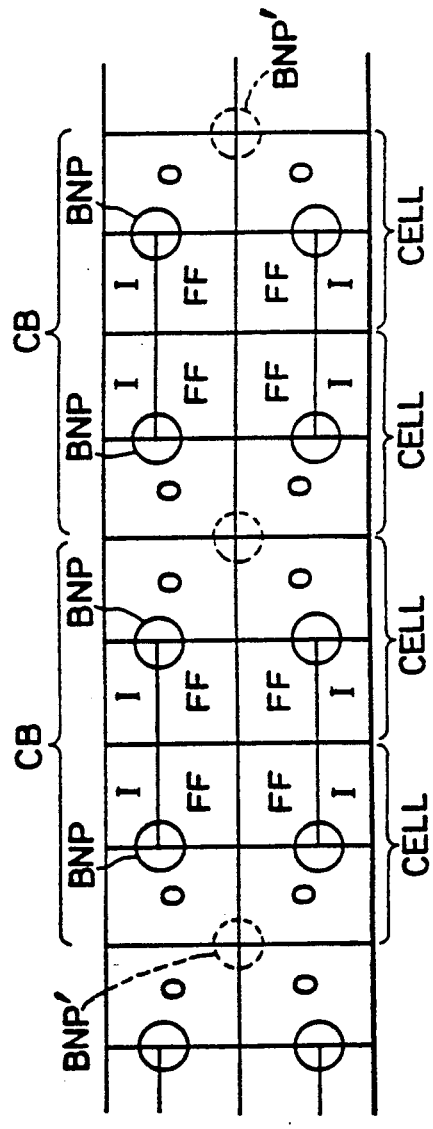
FIGS. 11, 14 and 15 are layout views illustrating the location of the cell blocks chip an a layout of each cell block constituting the input circuit, the output circuit, and the flip-flop in a case where the present invention is applied to a gate array.
Figure 14:
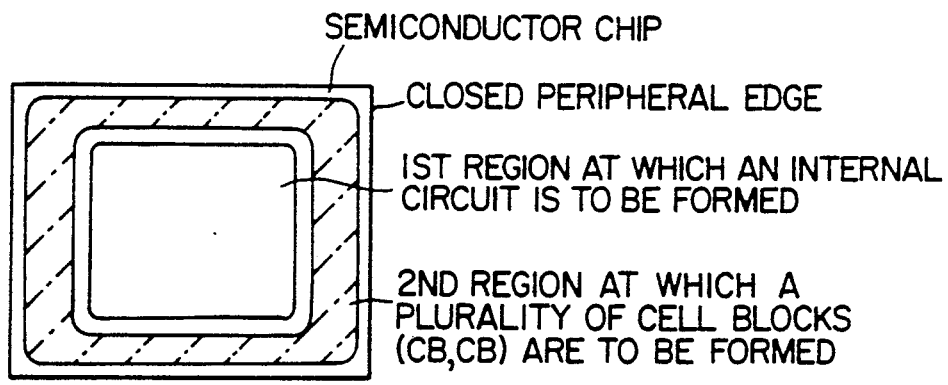
Figure 15:
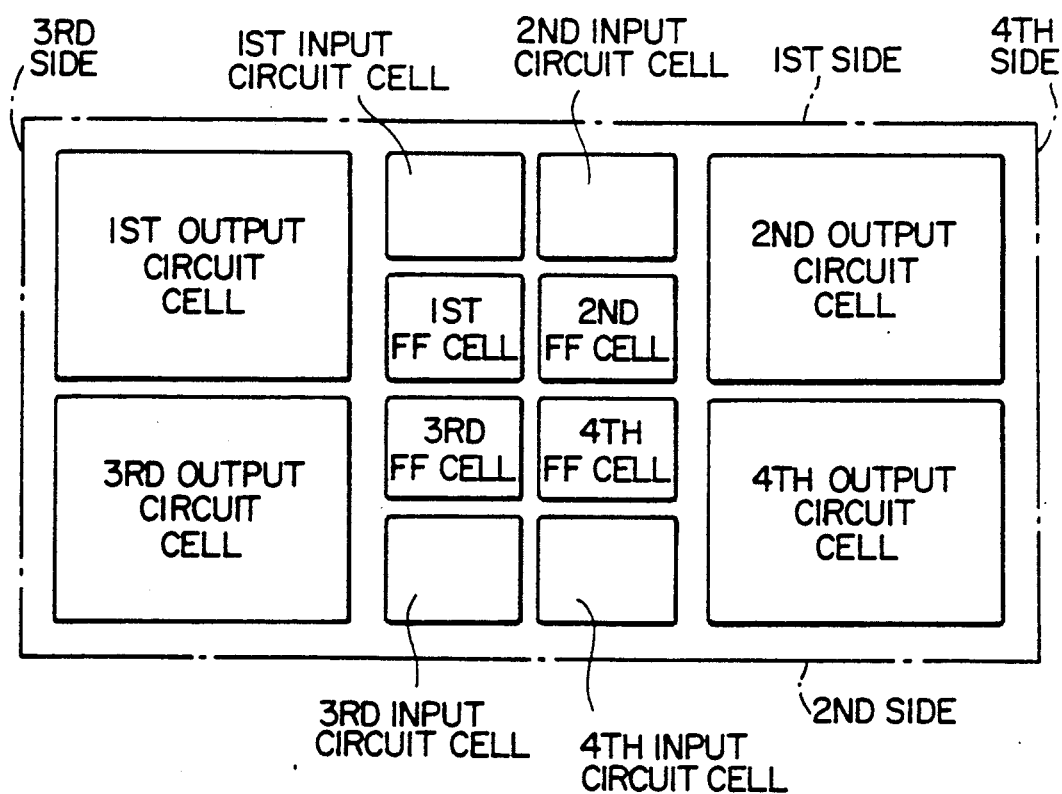

Next, FIG. 14 shows the location of the cell blocks on a semiconductor chip and FIGS. 11 and 15 show a suitable embodiment of the layout of cells including input circuits, output circuits, and scan flip-flops arranged corresponding to the respective input/output pins in a case where the present invention is applied to a gate array.

In this embodiment, a set of input circuit cells I, output circuit cells O, and flip-flops FF is in respective areas an a semiconductor chip corresponding to a pin, each of these components being formed in a rectangular shape so as to have sides thereof respectively overlapped or which are in common with each other, thereby forming a rectangular shape as a whole. Four basic cells each comprising a rectangular area onthe chip and including an input circuit cell I, an output circuit cell O, and a flip-flop FF together constitute a cell block CB, which is arranged as a rectangular shaped section along the outer edges or periphery of the chip.

In four basic cells CELL's of each cell block CB, the rectangular configuration thereof is horizontally and vertically symmetric with respect to a flip-flop cell FF located at the center thereof.

Moreover, for each basic cell CELL, a CCB bump BNP is disposed as an electrode at the central position, namely, a position where the pertinent sides are of three cells, that is, the input circuit cell I, the output circuit cell O, and the flip-flop cell FF and which sides overlap or are in common.

Incidentally, a dotted line$^{BNP}$ denotes a position where a power supply pin is arranged when necessary.

Between the respective cells, between each bump BNP and the input circuit cell I or the output circuit cell O, and between each flip-flop cell FF and the input circuit cell I or the output circuit cell O, there are respectively established connections according to the multilayer wiring technology, thereby configuring a desired circuit. Furthermore, since each cell has a regular structure, an automatic designing can be readily applied to the wirings of the circuit.

According to the layout of the embodiment above, since three circuit cells disposed corresponding to a pin are arranged with the respective sides thereof being overlapped with each other, the length of the wiring connections between the circuits can be minimized.

In addition, since the flip-flop cell FF is located at the central position of the basic cell CELL, when many clock signal lines to be arranged along a direction of cell arrangement are disposed around the central portion of the cells, only a clock signal line is required for two rows of bumps, which enables to reduce the length of the branch signal lines to be connected between each signal line and terminals in each cell.

Moreover, for the basic cells, the input circuit cells I's and the output circuit cells O's are brought into contact with each other in this arrangement, which consequently facilitates the connection of transistors in two adjacent cells so as to construct a circuit with a higher driving performance.

Furthermore, since each bump is located at the central position of the pertinent basic cell, also in a case where two rows of bumps are disposed to provide a lot of input/output pins in a chip having a limited size, a short circuit is prevented between the bumps. At the same time, also in a case where a bump is selectively connected to one selected from the input circuit I, the output circuit O, and the flip-flop FF, the length of the wiring can be reduced.

Incidentally, in a logic LSI having such a diagnosis circuit described above, the operation of the diagnosis circuit is necessary only in a test. If the shift register for the test is powered also in an ordinary operation, the power requirements of the overall LSI is increased due to the unnecessary power consumption.

Figure 12:
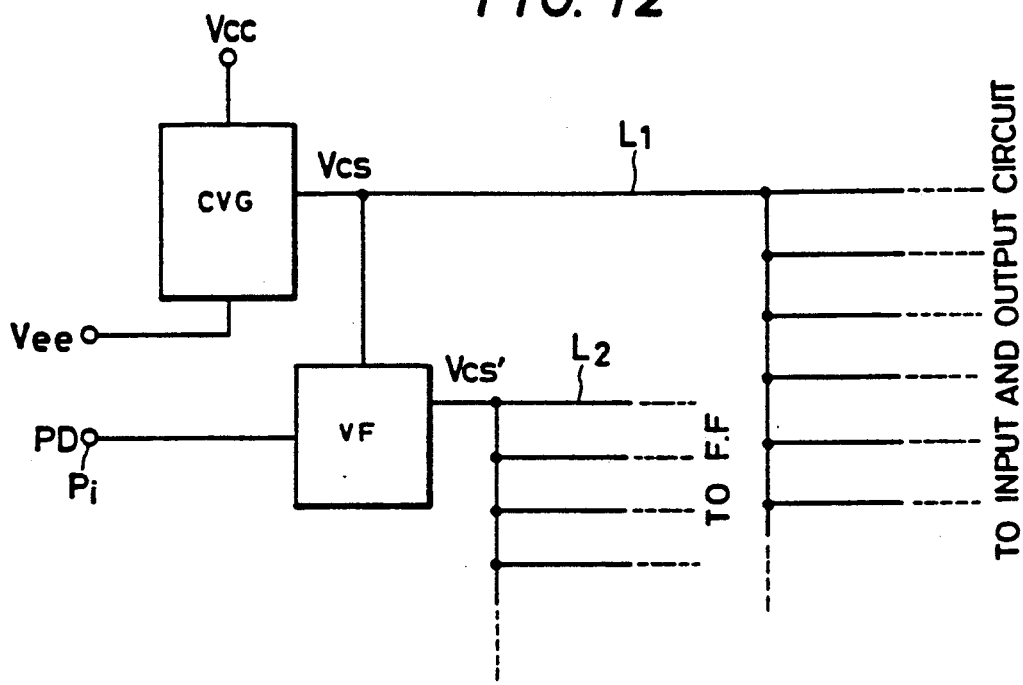
FIG. 12 is a schematic diagram depicting an example of a power down system in a logic LSI to which the present invention is applied.

To avoid such a disadvantageous condition, the logic LSI integrated with the diagnosis circuit is desirably provided with a power down circuit as shown in FIG. 12.

Of a constant voltage Vcs applied to the base configuring a constant current source of various logic gate circuits constituting the input circuits, the output circuits, the scan flip-flops, and the internal logic circuit, only a constant voltage Vcs supplied to the constant current source of the scan flip-flops is made to be effective in a test operation by the power down circuit of FIG. 12 such that the supplied voltage is lowered in an ordinary operation so as to prevent the current from flowing from the constant current source, thereby minimizing the power consumption. Consequently, in the embodiment of FIG. 12, two kinds of constant voltages are to be generated in response to the control signal applied thereto from an external device.

That is, in FIG. 12, reference symbol CVG indicates a constant voltage generate circuit generating a constant voltage to be supplied to the constant current source. The constant voltage Vcs generated by the constant voltage generate circuit CVG is distributed through the power lines L1 branching in the circuit so as to be fed to the input circuits, the output circuits, and the internal logic circuit of the LSI chip and further to be delivered to a voltage follower VF with a control terminal, the voltage follower VF being a new feature of this embodiment. A constant voltage Vcs' having the same level undergone an impedance transformation in the voltage follower VF is supplied via the power lines L2 to the constant current source in the scan flip-flops disposed corresponding to the input/output circuits. Namely, when the control signal PD applied to an external control terminal Pi is set to a level indicating the power down mode, the current path is changed over in the voltage follower, thereby setting the voltage Vcs' to a level in the neighborhood of that of the $V_{EE}$. When the voltage Vcs' is supplied to the base terminals of the transistors $Q_{61}$, $Q_{62}$, $Q_{63}$, $Q_{64}$, and $Q_{65}$ respectively designated by CC1, CC2, CC3, CC4, and CC5 in FIG. 10, the current flowing into the current power source of the scan flip-flops is interrupted, thereby setting the LSI in the low power consumption mode.

Incidentally, since the internal logic circuit includes therein a plurality of voltage followers, the constant voltage Vcs generated by the constant voltage generate circuit CVG is supplied to the constant current source of the respective logic gates through the pertinent voltage followers.

Figure 13:
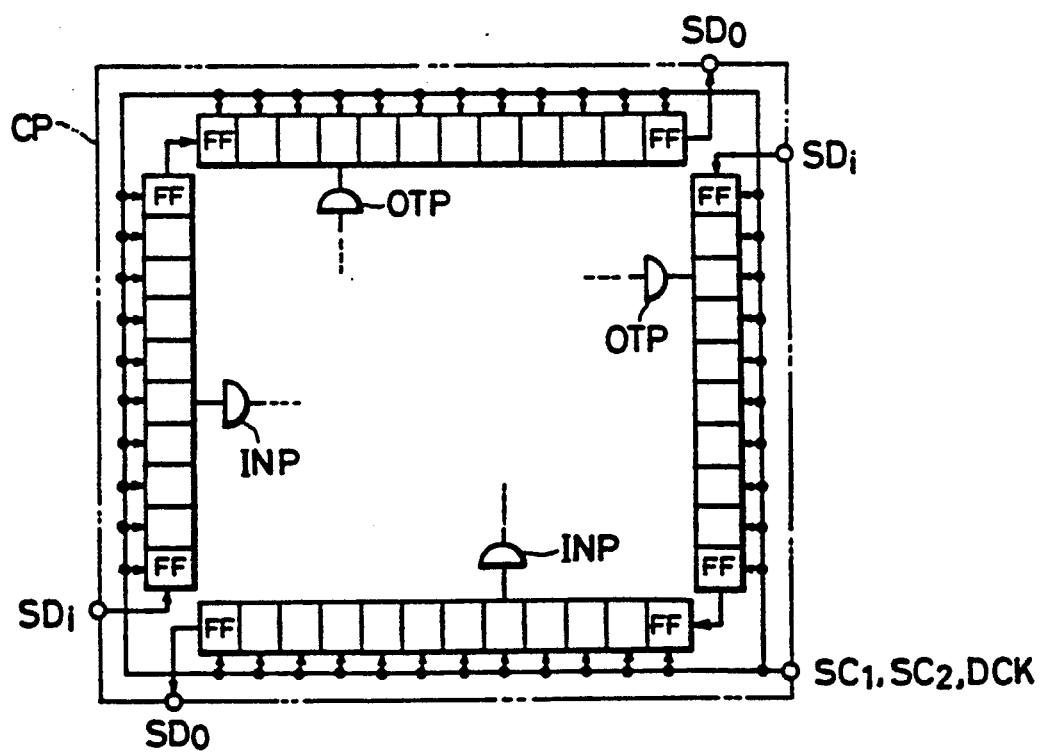
FIG. 13 is a schematic diagram of an overall LSI chip showing a configuration example of a shift register.

FIG. 13 shows an alternative embodiment of two groups of test shift registers formed in a separated manner, namely, all of the scan flip-flops FF's disposed corresponding to the respective input/output circuits are not connected in a cascade to form a shift register.

That is, in the embodiment of FIG. 13, the scan flip-flops FF's disposed in the top side and in the left side are connected in a cascade to form a first shift register, whereas the scan flip-flops FF's disposed in the bottom side and in the right side are connected in a cascade to form a second shift register. Accordingly, two sets of scan-in terminals SDi and the scan-out terminal SDo are arranged corresponding to these two shift registers, respectively. However, the scan clocks SC1-SC2 and the data latch clock DCK can be commonly used for both shift registers. That is, one input terminal of the clocks SC1, SC2, and DCK need only be disposed for the respective shift registers.

As described above, there are disposed two separate shift registers so as to enable to feed test data to two scan paths or to read output data therefrom at the same time. Consequently, the time required to set the test data and the time necessary to read out the data are reduced.

In the embodiment above, two separate shift registers are configured with test shift registers; however, in the range allowable with respect to the number of pins, an arbitrary number of shift registers may be formed, for example, for each flip-flop at the respective corner of the chip.

Moreover, in the embodiment above, a description has been made only of a diagnosis circuit disposed at an exit/entry of data, since the size and complexity of the test pattern is increased as the size of the logic LSI becomes greater, there may be employed a diagnosis method in which a test shift register is configured by connecting in a cascade the flip-flops of the internal logic circuit such that test data is directly inputted to a deep section of the internal logic circuit and output data is read from a logic gate located at a deep section of the internal logic circuit. Such a diagnosis method and the diagnosis method according to the present invention can be combined so as to effect a more efficient diagnosis.

Description has been made of a case where the present invention substantially made by the present inventor is applied to a gate array which is a utilization field as a background of the present invention; however, the present invention is not restricted by this case and is also applicable to a logic LSI of the bipolar type, a logic LSI of the MOS type, semiconductor memory devices mounted on a common board, and a system including various digital IC's.

While the present invention has been described with reference to the particular illustrative embodiments, it is not restricted by those embodiments but only by the appended claims. It is to be appreciated that those skilled in the art can change and modify the embodiments without departing from the scope and spirit of the invention.

What is claimed is:

1. A semiconductor integrated circuit device comprising:
   a semiconductor chip having a main surface and a closed peripheral edge;
   an internal circuit region formed at a predetermined portion of the main surface; and
   a cell block region formed at the main surface between the internal region and the closed peripheral edge wherein said cell block region includes a plurality of cell blocks, each being of a rectangular-shape, and having a first side, a second side opposite to the first side, a third side disposed between the first and second sides and a fourth side opposite to the third side, each cell block including:
   first to fourth flip-flop cells which are disposed at a substantially central portion of the cell block,
   first to fourth input circuit cells, the first input circuit cell being disposed between the first flip-flop cell and the first side, the second input circuit cell being disposed between the second flip-flop cell and the first side, the third input circuit cell being disposed between the third flip-flop cell and the second side, and the fourth input circuit cell being disposed between the fourth flip-flop cell and the second side, and
   first to fourth output circuit cells, the first output circuit cell having one side adjacent to the third side of the cell block and having an opposite side adjacent to the first flip-flop and input circuit cells, the second output circuit cell having one side adjacent to the fourth side of the cell block and having an opposite side adjacent to the second flip-flop and input circuit cells, the third output circuit cell having one side adjacent to the third side of the cell block and having an opposite side adjacent to the third flip-flop and input circuit cells, and the fourth output circuit cell having one side adjacent to the fourth side of the cell block and having an opposite side adjacent to the fourth flip-flop and input circuit cells.

2. A semiconductor integrated circuit device according to claim 1, wherein the plurality of cell blocks includes clock signal lines for applying operational clock signals to the first to fourth flip-flop cells.

3. A semiconductor integrated circuit device according to claim 1, wherein the plurality of cell blocks each includes a plurality of external pads which are respectively formed to be coupled to at least a predetermined one of the first to fourth input circuit cells and the first to fourth output circuit cells, the external pads being formed at predetermined positions between the first input circuit and output circuit cells, between the second input circuit and output circuit cells, between the third input circuit and output circuit cells, and between the fourth input circuit and output circuit cells, respectively.

4. A semiconductor integrated circuit device according to claim 1, wherein the plurality of cell blocks are arranged at the cell block region so that the second sides of the plurality of cell blocks are adjacent to the closed peripheral edge.

* * * * *